US012159765B2

(12) United States Patent
Collins et al.

(10) Patent No.: US 12,159,765 B2
(45) Date of Patent: Dec. 3, 2024

(54) METHOD AND APPARATUS FOR PLASMA GENERATION

(71) Applicant: MKS Instruments, Inc., Andover, MA (US)

(72) Inventors: Ron Collins, Londonderry, NH (US); Andrew Cowe, Andover, MA (US); Gordon Hill, Arlington, MA (US)

(73) Assignee: MKS Instruments, Inc., Andover, MA (US)

( * ) Notice: Subject to any disclaimer, the term of this patent is extended or adjusted under 35 U.S.C. 154(b) by 302 days.

(21) Appl. No.: 17/902,208

(22) Filed: Sep. 2, 2022

(65) Prior Publication Data

US 2024/0079209 A1 Mar. 7, 2024

(51) Int. Cl.
*H01J 37/32* (2006.01)

(52) U.S. Cl.
CPC ...... *H01J 37/321* (2013.01); *H01J 37/32513* (2013.01); *H01J 37/32522* (2013.01); *H01J 37/32568* (2013.01)

(58) Field of Classification Search
CPC ............... H01J 37/321; H01J 37/32513; H01J 37/32522; H01J 37/32568
See application file for complete search history.

(56) References Cited

U.S. PATENT DOCUMENTS

| 5,187,072 A | 2/1993 | Cullimore et al. |
| 5,517,786 A | 5/1996 | Peissig et al. |
| 5,637,279 A | 6/1997 | Besen et al. |
| 5,707,451 A | 1/1998 | Robles et al. |

(Continued)

FOREIGN PATENT DOCUMENTS

| EP | 2312612 B1 | 3/2017 |
| GB | 2461816 A | 1/2010 |

(Continued)

OTHER PUBLICATIONS

"Notification of Transmittal of the International Search Report and the Written Opinion of the International Searching Authority, or the Declaration," International Filing Date: Aug. 4, 2023, International Application No. PCT/US2023/029472, Date of Mailing: Nov. 20, 2023, pp. 1-8.

(Continued)

*Primary Examiner* — Abdullah A Riyami
*Assistant Examiner* — Syed M Kaiser
(74) *Attorney, Agent, or Firm* — Cesari and McKenna, LLP

(57) ABSTRACT

A plasma source is provided that is configured to form a section of a wall of a vacuum component. The plasma source comprises a body including a dielectric member, a first surface exposed to an exterior region of the vacuum component, and a second surface exposed to an interior region of the vacuum component. The plasma source also comprises at least one electrode disposed in a receiving channel of the body with at least a portion of the dielectric member located adjacent to the at least one electrode in the receiving channel. The plasma source further comprise at least one discharge region adjacent to the receiving channel within the body. The at least one discharge region is exposed to the interior region of the vacuum component via an opening on the second surface of the body.

26 Claims, 10 Drawing Sheets

(56) References Cited

U.S. PATENT DOCUMENTS

| | | | |
|---|---|---|---|
| 5,812,403 | A | 9/1998 | Fong et al. |
| 5,827,370 | A | 10/1998 | Gu |
| 6,156,667 | A | 12/2000 | Jewett |
| 6,187,072 | B1 | 2/2001 | Cheung et al. |
| 6,193,802 | B1 | 2/2001 | Pang et al. |
| 6,225,222 | B1 | 5/2001 | Yang et al. |
| 6,255,222 | B1 | 7/2001 | Xia et al. |
| 6,354,241 | B1 | 3/2002 | Tanaka et al. |
| 6,360,685 | B1 | 3/2002 | Xia et al. |
| 6,366,346 | B1 | 4/2002 | Nowak et al. |
| 6,517,786 | B1 | 2/2003 | Best et al. |
| 6,680,420 | B2 | 1/2004 | Pang et al. |
| 7,037,376 | B2 | 5/2006 | Harvey et al. |
| 7,060,234 | B2 | 6/2006 | Pokharna et al. |
| 7,494,628 | B2 | 2/2009 | Pokharna et al. |
| 7,964,040 | B2 | 6/2011 | Rasheed et al. |
| 8,747,762 | B2 | 6/2014 | Dickinson et al. |
| 8,852,520 | B2 | 10/2014 | Hur et al. |
| 9,314,824 | B2 | 4/2016 | Gu et al. |
| 9,472,381 | B2 | 10/2016 | Hur et al. |
| 9,597,634 | B2 | 3/2017 | Dickinson et al. |
| 9,649,592 | B2 | 5/2017 | Cox et al. |
| 9,867,238 | B2 | 1/2018 | Cox et al. |
| 10,115,571 | B2 | 10/2018 | Dickinson |
| 10,179,941 | B1 | 1/2019 | Khan et al. |
| 10,187,966 | B2 | 1/2019 | Wang et al. |
| 10,337,105 | B2 | 7/2019 | Hill |
| 10,535,506 | B2 | 1/2020 | Hill et al. |
| 11,024,489 | B2 | 6/2021 | Hill et al. |
| 11,367,598 | B2 | 6/2022 | Hill et al. |
| 2003/0007910 | A1 | 1/2003 | Diamant Lazarovich et al. |
| 2003/0027428 | A1 | 2/2003 | Ng et al. |
| 2004/0001787 | A1 | 1/2004 | Porshnev et al. |
| 2004/0131513 | A1 | 7/2004 | Lazarovich et al. |
| 2005/0011445 | A1 | 1/2005 | Upham |
| 2005/0194099 | A1 | 9/2005 | Jewett, Jr. et al. |
| 2006/0107973 | A1 | 5/2006 | Leung |
| 2006/0207630 | A1 | 9/2006 | Sakai et al. |
| 2007/0095282 | A1 | 5/2007 | Moon et al. |
| 2007/0286766 | A1 | 12/2007 | Choi |
| 2008/0057726 | A1 | 3/2008 | Kim |
| 2009/0196765 | A1 | 8/2009 | Dyer et al. |
| 2010/0192542 | A1 | 8/2010 | Min et al. |
| 2011/0089017 | A1 | 4/2011 | Hur et al. |
| 2011/0272592 | A1 | 11/2011 | Kellogg et al. |
| 2013/0087287 | A1 | 4/2013 | Hur et al. |
| 2013/0133697 | A1 | 5/2013 | Stockman et al. |
| 2013/0146225 | A1 | 6/2013 | Chen et al. |
| 2013/0164943 | A1 | 6/2013 | Koshi et al. |
| 2014/0272108 | A1* | 9/2014 | Holber .................. C23C 16/272 118/723 R |
| 2015/0129047 | A1 | 5/2015 | Gu et al. |
| 2015/0252472 | A1 | 9/2015 | Ko et al. |
| 2015/0252473 | A1 | 9/2015 | Dickinson |
| 2015/0314233 | A1 | 11/2015 | Hur et al. |
| 2017/0173521 | A1 | 6/2017 | Dickinson et al. |
| 2017/0200591 | A1 | 7/2017 | Hill et al. |
| 2017/0221683 | A1 | 8/2017 | Kim et al. |
| 2018/0151336 | A1* | 5/2018 | Sakka ............... H01J 37/32834 |
| 2019/0062947 | A1* | 2/2019 | Savas ................ H01J 37/32651 |
| 2019/0198297 | A1* | 6/2019 | Aramaki ............. H01L 21/3065 |
| 2019/0221404 | A1* | 7/2019 | Yeom ................ H01J 37/32541 |
| 2019/0261479 | A1* | 8/2019 | Sekido .................. H02M 3/156 |
| 2020/0219729 | A1* | 7/2020 | Kamimura ............... H05H 1/46 |
| 2020/0286712 | A1 | 9/2020 | Polak et al. |
| 2020/0365405 | A1* | 11/2020 | Zucker ............. H01J 37/32568 |
| 2021/0050213 | A1* | 2/2021 | Savas ................ H01J 37/32321 |
| 2021/0082672 | A1* | 3/2021 | Hill .......................... F16K 1/22 |
| 2021/0217589 | A1* | 7/2021 | Savas ................ H01J 37/32146 |
| 2022/0048081 | A1 | 2/2022 | Hill |

FOREIGN PATENT DOCUMENTS

| | | |
|---|---|---|
| JP | H02-26804 A | 1/1990 |
| JP | H08-183107 A | 7/1996 |
| JP | H10168574 B1 | 6/1998 |
| JP | H11222680 A | 8/1999 |
| JP | 2002-173768 A | 6/2002 |
| JP | 2005-175460 A | 6/2005 |
| JP | 2005303255 A | 10/2005 |
| JP | 2010234195 A | 10/2010 |
| JP | 2010247126 A | 11/2010 |
| JP | 2011511615 A | 4/2011 |
| JP | 2013-089537 A | 5/2013 |
| JP | 2013-519188 A | 5/2013 |
| JP | 2014520385 A | 8/2014 |
| JP | 2015-213171 A | 11/2015 |
| KR | 1020090028991 A | 3/2009 |
| KR | 101063515 B1 | 9/2011 |
| KR | 10-1932859 B1 | 3/2019 |
| WO | WO-00/51714 A1 | 9/2000 |
| WO | WO- 2009/097068 A1 | 8/2009 |
| WO | WO- 2011/092186 A1 | 8/2011 |
| WO | WO-2014/062006 A1 | 4/2014 |
| WO | 2015-023945 A1 | 2/2015 |
| WO | WO-2015/160057 A1 | 10/2015 |
| WO | WO-2015/181945 A1 | 12/2015 |
| WO | 2016-149050 A1 | 9/2016 |

OTHER PUBLICATIONS

"AERIS™-G Plasma Abatement System," Semiconductor (/Semiconductor), Applied Materials, Applied Material, Inc., Retrieved from the Internet <http://www.appliedmaterials.com/products/aeris-g-plasma-abatement-system.html>, Retrieved from the Internet on Sep. 9, 2021, pp. 1-4.

"AERIS™-SI," Semiconductor (/Semiconductor), Applied Materials, Applied Material, Inc., Retrieved from the Internet <http://www.appliedmaterials.com/products/aeris-si.html>, Retrieved from the Internet on Sep. 9, 2021, pp. 1-3.

Hur, Min, et al. "AC Low-pressure Plasmas Generated by Using Annular-shaped Electrodes for Abatement of Pollutants Emitted during Semiconductor Manufacturing Processes," Journal of the Korean Physical Society, vol. 59, No. 4, Oct. 14, 2011, pp. 2742-2749.

"Nanochip FAB Solutions (/Nanochip/Nanochip-FAB-Solutions)," Nanochip Automotive Electronics: Gearing Up, Applied Materials, Applied Material, Inc., Retrieved from the Internet <http://www.appliedmaterials.com/nanochip/nanochip-fab-solutions/july-2016/new-aeris-s-technology-helps-increase-subfab-safety-while-reducing-emissions.html>, Jul. 2016, pp. 1-6.

"Notification of Transmittal of the International Search Report and the Written Opinion of the International Searching Authority, or the Declaration," International Filing Date: Jul. 26, 2022, International Application No. PCT/US2022/074132 Applicant: MKS Instruments, Inc., Date of Mailing: Nov. 14, 20202 pp. 1-10.

U.S. Appl. No. 17/391,724, filed Aug. 2, 2021 by Gordon Hill et al. for Method and Apparatus for Plasma Generation, pp. 1-30.

* cited by examiner

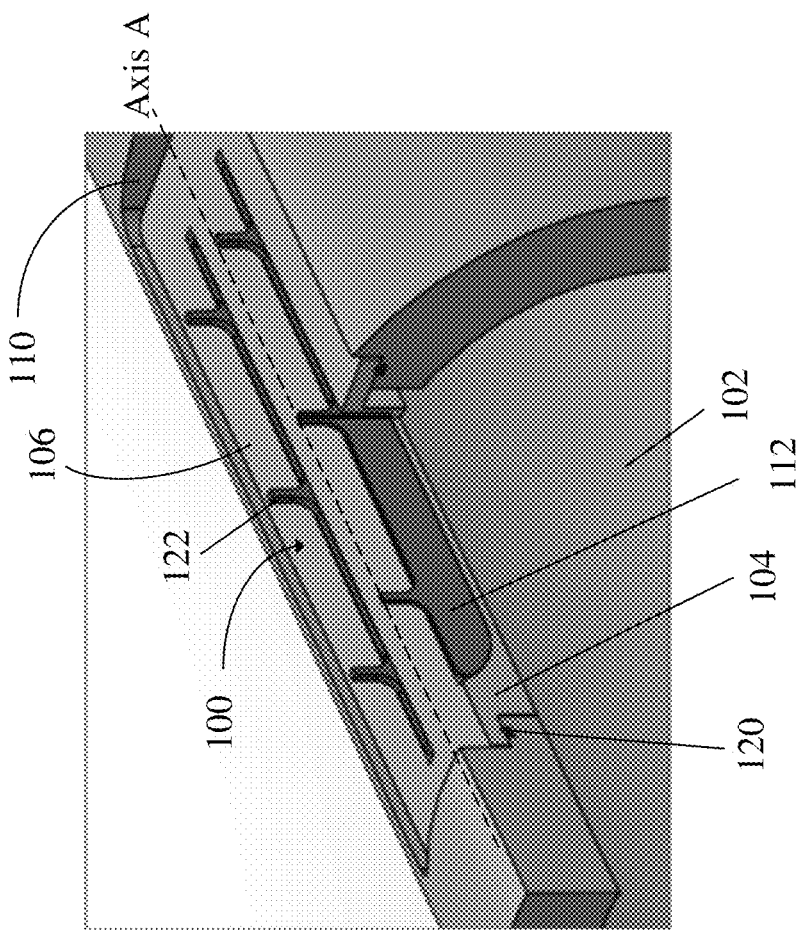
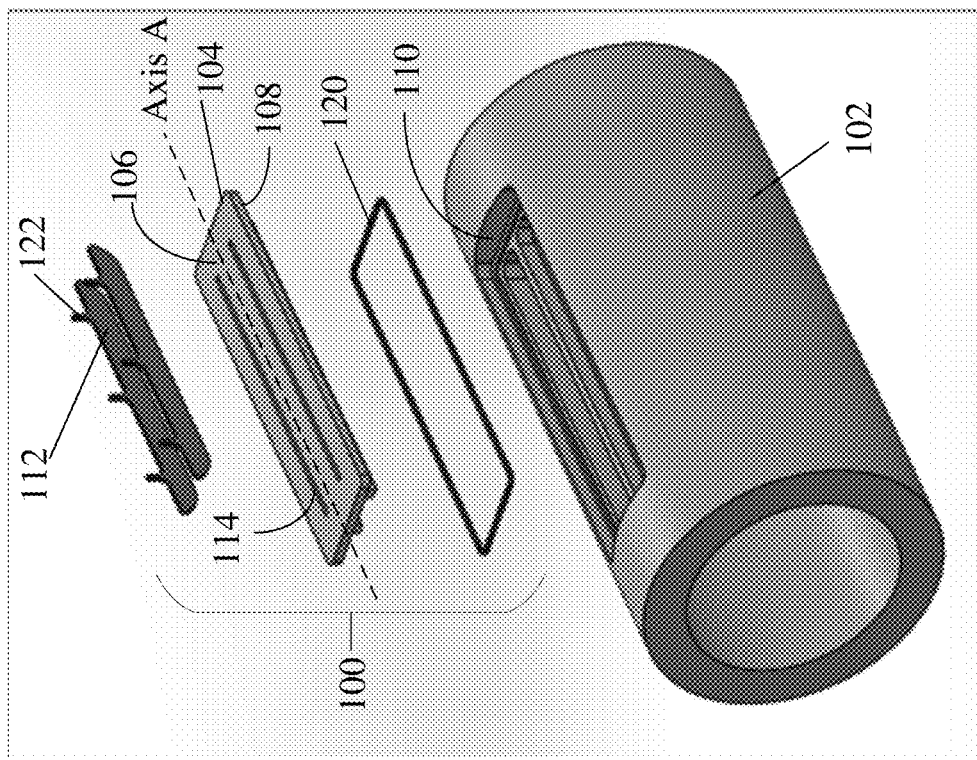
FIG. 1b
FIG. 1a

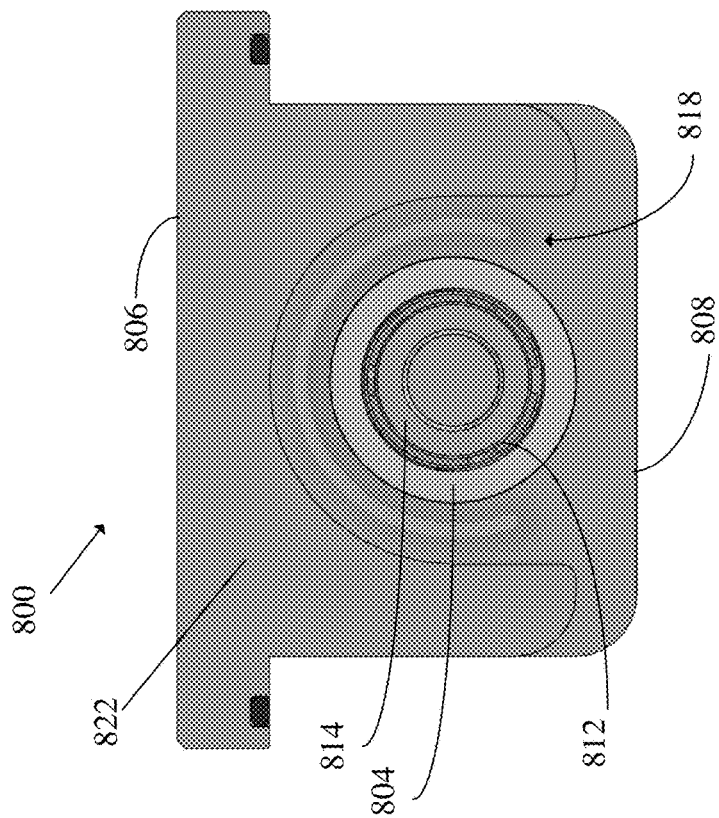
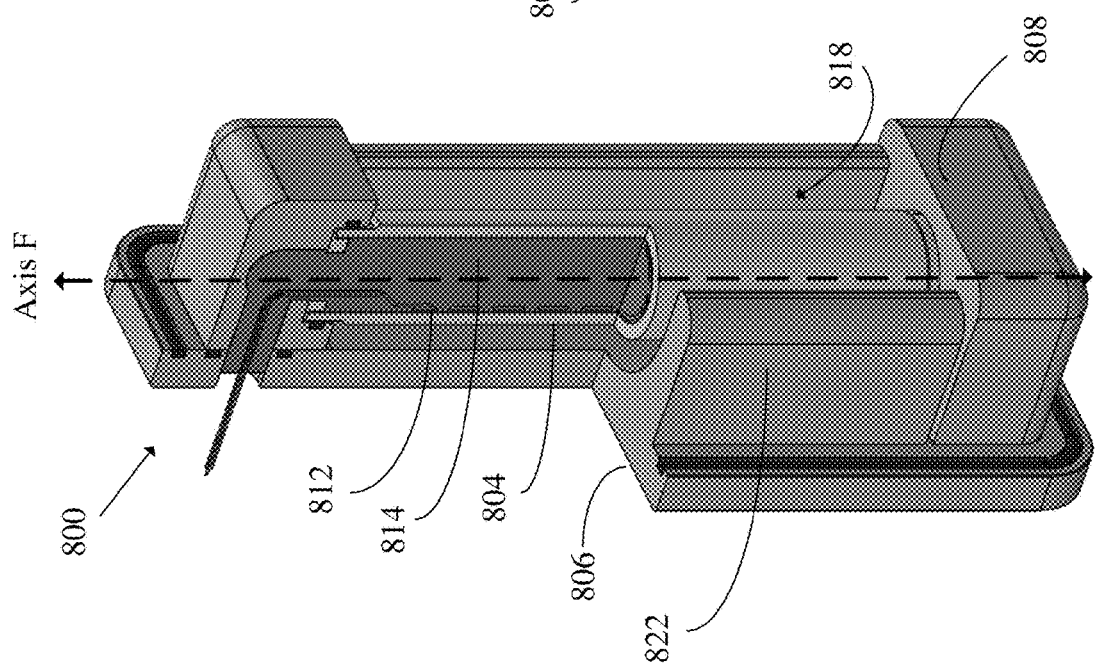
FIG. 8b
FIG. 8a

METHOD AND APPARATUS FOR PLASMA GENERATION

FIELD OF THE INVENTION

The invention generally relates to a plasma source configured to generate one or more regions of plasmas within the plasma source.

BACKGROUND

Deposition processes, including chemical vapor deposition (CVD) processes, are commonly used in the manufacturing of semiconductor devices. For example, in a typical CVD process, reactant gases are introduced into a reaction chamber and directed to a heated substrate to induce controlled chemical reactions, which result in the deposition of a thin film on the surface of the substrate. During the deposition process, chamber pressure is precisely controlled by one or more mechanical devices, such as vacuum valves, connected downstream from the reaction chamber. For example, an isolation valve is typically connected directly to the exhaust gas port of the reaction chamber, a throttle valve is situated downstream from the isolation valve, and a vacuum pump is located further downstream from both of the isolation and throttle valves. The plumbing between the reaction chamber and the vacuum pump (e.g., the pipelines and valves) is generally referred to as a foreline, a roughing line or a vacuum pumping line.

During a deposition, process, the throttle valve can cycle between open and closed positions to regulate the gas pressure inside of the reaction chamber. Most of the material produced from the reactant gases is deposited on the substrate surface in the reaction chamber. However, some material is also deposited on surfaces outside of the reaction chamber, such as on the throttle valve. As unwanted material accumulates on the throttle valve, the throttle valve's useful life can be reduced by, for example, introduction of seal wear, load addition, requirement for high torque drive systems, and alteration of conductance characteristics. Ultimately, unwanted material deposits on a throttle valve diminish the precise operation of the valve, thereby reducing the valve's ability to control gas pressure inside of the reaction chamber. Other vacuum valves along the vacuum pumping line can be similarly affected by unwanted material deposition. In addition, the position of a throttle valve during closed loop pressure control can provide useful diagnostic information. However, because valve position varies with quantity of deposition, unwanted deposition on a valve can limit the usefulness of valve positioning as an indication of other changes in the system.

Typically, an operator needs to manually remove valves in a mechanical system for cleaning or replacement. This requires downtime of the tool and venting of the foreline plumbing. Alternatively, remote plasma sources have been used for pump and foreline cleaning, where the plasma output is directed at the foreline, which may not be sufficiently close to the valves to provide optimized and targeted result.

Further, during a wafer deposition process, unwanted material produced from the reactant gases can also be deposited along the vacuum pumping line as the reactant gases are pumped out from the processing chamber through the pumping line. Similar to the throttle valve, accumulation of the unwanted material in the vacuum pumping line can produce a host of problems, including clogging the pumping line and other downstream equipment, interfering with normal operation of the associated vacuum pump, reducing the vacuum pump's useful life, and contaminating processing steps in the processing chamber.

It is known that cylindrical plasma sources/generators are available for valve and pumping line cleaning, but these devices are difficult to scale, especially with pumping line structures of larger sizes, due to practical ceramic fabrication limitations and constraints. In addition, many of the existing plasma generators produce non-uniform discharge current density that concentrates mostly at the edge of the buried electrodes, which can lead to non-uniform sputtering and concentrated erosion of the electrodes at their edges. Other known plasma generators have shortcomings including limited conductance due to a lack of line of sight between the input and output ports of the generators (e.g., a labyrinth structure), manufacturing complexity due to complexity in structure and/or material composition, and usage of inductive coupling for plasma generation that may cause difficulty igniting plasma.

SUMMARY

Therefore, there is a need for capacitively-coupled plasma sources capable of producing high conductance and enabling substantially unrestricted gas flow while supporting scaling to components of various sizes (e.g., pumping lines with large pipe diameters), various geometries (e.g., cylindrical, rectangular or square geometries), and various types (e.g., vacuum piping, vacuum chambers, vacuum pumps, CVD reactors or etch chambers). For example, the plasma sources described herein can be configured for integration with a pumping line of a vacuum system to create localized plasmas at one or more target locations where deposition is problematic for the pumping line. In general, the plasma sources described herein are scalable and modular in design and can be easily integrated into vacuum components of various types, sizes, geometries and usages.

In one aspect, a plasma source is provided that is configured to form a section of a wall of a vacuum component. The plasma source comprises a body comprising a dielectric member, a first surface exposed to an exterior region of the vacuum component, and a second surface exposed to an interior region of the vacuum component. The body is adapted to be disposed into an aperture of the wall of the vacuum component. The plasma source also comprises at least one electrode disposed in a receiving channel of the body with at least a portion of the dielectric member located adjacent to the at least one electrode in the receiving channel. The at least one electrode is electrically exposed to the exterior region of the vacuum component at the first surface for receiving a radio-frequency (RF) current. The plasma source further comprise at least one discharge region adjacent to the receiving channel within the body. The at least one discharge region is exposed to the interior region of the vacuum component via an opening on the second surface of the body. A plasma is adapted to be formed within the at least one discharge region.

In another aspect, a method of manufacturing a plasma source for forming a section of a wall of a vacuum component is provided. The method comprises providing at least one electrode with one or more electrical contacts and disposing the at least one electrode in a receiving channel of a body. The body comprises a dielectric member, a first surface adapted to be exposed to an exterior region of the vacuum component, and a second surface adapted to be exposed to an interior region of the vacuum component. The method also includes locating at least a portion of the dielectric member adjacent to the at least one electrode in the receiving channel and disposing the body into an aperture of the wall of the vacuum component such that the one or more electrical contacts of the at least one electrode is exposed to the exterior region of the vacuum component at the first surface of the body and the one or more electrical contacts being accessible from the exterior region of the vacuum component. The method further includes forming at least one discharge region adjacent to the receiving channel within the body. The at least one discharge region is exposed to an interior region of the vacuum component via an opening on the second surface of the body. A plasma is adapted to be formed within the at least one discharge region.

Any of the above aspects can include one or more of the following features. In some embodiments, the at least one electrode is a conductive flat rail buried into and substantially surrounded by the dielectric member. In some embodiments, the flat rail is inserted into a slot formed in the dielectric member. In some embodiments, a neighboring section of the wall of the vacuum component relative to the plasma source is grounded to generate the plasma within the discharge region of the plasma source. In some embodiments, the at least one electrode comprises a plurality of conductive flat rails buried substantially parallel relative to each other within the dielectric member.

In some embodiments, the electrode comprises an electrically and thermally conductive cylindrical busbar embedded in the dielectric member. In some embodiments, the plasma source further includes a heat sink disposed in the receiving channel substantially surrounded by the electrode and the dielectric member.

In some embodiments, the plasma source includes a substantially cylindrical ground member radially surrounds the electrode, the dielectric member and the discharge region. The ground member is adapted to be electrically grounded to generate the plasma within the discharge region. In some embodiments, the discharge region is substantially ring-shaped and concentrically sandwiched between the ground member and the dielectric member having the electrode embedded therein. In some embodiments, the plasma source is oriented such that a longitudinal axis of the plasma source, including the cylindrical electrode, the cylindrical ground member and the ring-shaped discharge region, extends substantially perpendicular to the wall of the vacuum component.

In some embodiments, the plasma source includes a ground member longitudinally encasing the electrode, the dielectric member and the discharge region. The ground member is adapted to be electrically grounded to generate the plasma within the discharge region. In some embodiments, the plasma source is oriented such that a longitudinal axis of the plasma source extends substantially parallel to the wall of the vacuum component.

In some embodiments, the plasma source further includes a vacuum seal located between the body and the vacuum component for providing a fluid seal between the plasma source and the vacuum component. In some embodiments, the at least one electrode and the dielectric member are joined by one of co-firing or bonding. In some embodiments, the body defines a thickness extending between the first and second surfaces, the thickness of the body being at least same as a thickness of the wall of the vacuum component.

In some embodiments, a plurality of the plasma source bodies are disposed into respective ones of apertures along various sections of the wall of the vacuum component to create an array of discharge regions exposed to the interior region of the vacuum component.

In some embodiments, a radio-frequency (RF) current is provided to the one or more electrical contacts of the at least one electrode, a ground element of the plasma source or a neighboring wall section of the vacuum component is electrically grounded, and a gas is provided to the interior region of the vacuum component that is adapted to flow into the discharge region of the plasma source via the opening on the interior surface of the body. Thereafter, the plasma in the at least one discharge region of the plasma source.

BRIEF DESCRIPTION OF THE DRAWINGS

The advantages of the invention described above, together with further advantages, may be better understood by referring to the following description taken in conjunction with the accompanying drawings. The drawings are not necessarily to scale, emphasis instead generally being placed upon illustrating the principles of the technology.

FIGS. 1a-1c show exploded, exterior and sectional views, respectively, of an exemplary plasma source 100 configured to form a section of a wall of a vacuum component, according to some embodiments of the present invention.

FIGS. 8a and 8b show sectional and top views, respectively, of yet another exemplary plasma source, according to some embodiments of the present invention.

DETAILED DESCRIPTION

In general, a plasma source described herein can include a capacitively-coupled plasma, or more specifically, a dielectric barrier discharge structure for generating a localized plasma discharge. The dielectric barrier discharge structure can be formed by (i) a supply electrode, (ii) a return electrode located adjacent to the supply electrode, and (iii) a barrier dielectric material proximate to the supply electrode and return electrode, such as between the supply and return electrodes. A radio-frequency, high-voltage alternating current can be supplied between the supply electrode and the return electrode to activate the dielectric barrier discharge structure, thereby generating a plasma localized within the dielectric barrier discharge structure. In some embodiments, the power of the resulting plasma is about 20 Watts to about 1000 Watts. Further, a supply electrode described herein generally refers to an electrode receiving an alternating voltage, e.g., about 300 to about 2000 V and about 100 khz to 13.6 Mhz, from a connected radio frequency power supply. A return electrode generally refers to an electrode maintained at a lower voltage relative to the supply electrode. For example, the return electrode can be electrically grounded, driven with opposite polarity, or biased to a potential with respect to ground. In some embodiments, the supply electrode and the return electrode of a dielectric barrier discharge structure are both embedded in a barrier dielectric material, with the return electrode being either electrically grounded or driven with opposite polarity. In some embodiments, the supply electrode is embedded in a barrier dielectric material while the electrically-grounded return electrode is outside of the barrier dielectric material. A buried electrode assembly generally refers to a structure including a barrier dielectric material and having at least one of a return electrode or a supply electrode embedded in the barrier dielectric material.

Figure 1C:
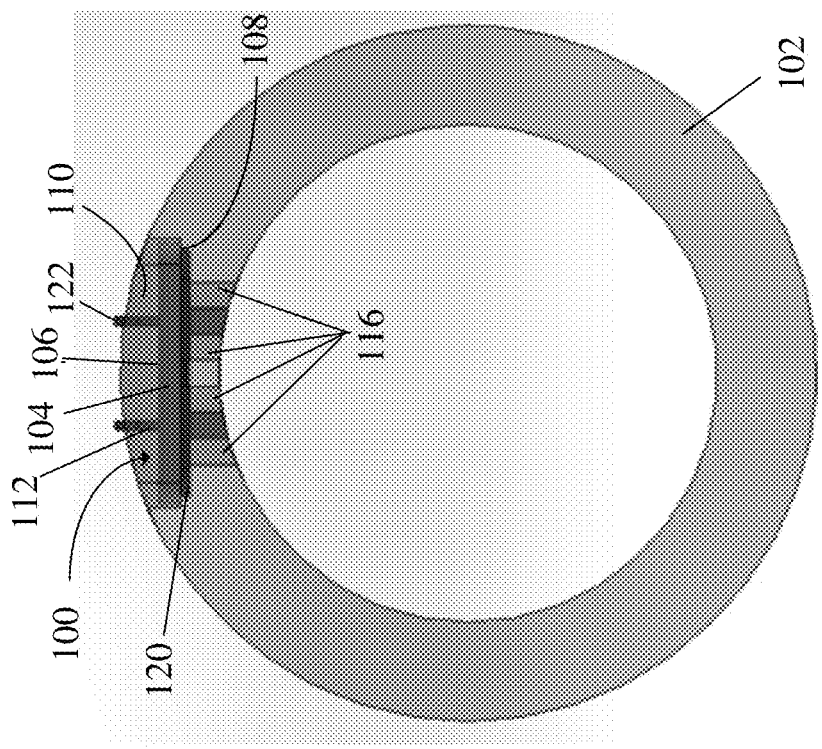

FIGS. 1a-1c show exploded, exterior and sectional views, respectively, of an exemplary plasma source 100 configured to form a section of a wall of a vacuum component 102, according to some embodiments of the present invention. The plasma source 100 is adapted to be disposed into an aperture 110 of a wall section of the vacuum component 102 such that a first surface 106 of the plasma source 100 is exposed to an exterior region of the vacuum component 102, and a second surface 108 of the plasma source, which is opposite of the first surface 106, is exposed to an interior region of the vacuum component 102.

As shown, the plasma source 100 is generally flat and includes a body 104 comprising a dielectric member. One or more electrodes 112 are disposed in a receiving channel 114 of the body 104 with at least a portion of the dielectric member located adjacent to each electrode 112. The one or more electrodes 112 can be buried into and substantially surrounded by the dielectric member of the body 104. In some embodiments, a potting material is disposed into the receiving channel 114 for bonding/holding in place the electrodes 112 in the receiving channel 114, where the potting material can have a similar dielectric constant as the dielectric member. The potting material is adapted to provide structural integrity and a thermally conductive path for heat dissipation. In some embodiments, each electrode 112 is electrically exposed to the exterior region of the vacuum component 102 from the first surface 106 of the plasma source 100 for receiving a radio-frequency (RF) current. Each electrode 112 can be made from an electrically conductive material, such as copper. The dielectric member of the plasma source body 104 can be a barrier dielectric member constructed from an electrically non-conductive material, such as a ceramic material. Further, the plasma source 100 includes one or more discharge regions 116 (as illustrated in FIG. 1c) adjacent to the receiving channel 114, where each discharge region 116 is configured to form a localized plasma therein that is exposed to the interior region of the vacuum component 102. In some embodiments, a vacuum seal 120 is located between the body 104 of the plasma source 100 and the vacuum component 102 to provide a fluid seal between the plasma source 104 and the vacuum component 102. As shown in FIG. 1a, the vacuum seal 120 can be configured to substantially encircle the perimeter of the second surface 108 of the plasma source 100, thereby providing a tight seal between the plasma source 104 and the aperture 110 of the vacuum component 102 within which the plasma source 100 is disposed.

In some embodiments, each of the one or more electrodes 112 of the plasma source 100 is a conductive flat rail embedded in and substantially surrounded by the dielectric member of the plasma source body 104. The body 104 can include one or more receiving channels 114 constructed as elongated slots along the longitudinal axis A of the body 104, where each slot 114 is configured to receive respective ones of the one or more flat rail electrodes 112. In some embodiments, these slots 114 form trenches that protrude beyond the second surface 108 of the body 104. As an example, the one or more electrodes 112 can comprise multiple flat rails, such as a pair of flat rail electrodes 112 shown in FIGS. 1a-1c, and the slots 114 can be located substantially parallel to each other in the dielectric member of the body 104 along the longitudinal axis A. When the flat rail electrodes 112 are inserted into the corresponding slots 114, the electrodes 112 are substantially parallel to each other within the dielectric member.

In some embodiments, at least one electrode of the multiple electrodes 112 serves as a supply electrode while a different electrode of the multiple electrodes 112 serves as ground electrode for forming a dielectric barrier discharge structure. Alternatively, the multiple electrodes 112 are all supply electrodes are electrically driven with adjacent segments of the wall of the vacuum component 102 electrically grounded to form a dielectric barrier discharge structure. In other alternative embodiments, the plasma source 100 does not form a barrier dielectric structure, in which case the one or more electrodes 112 are bare metal electrodes. As shown, each electrode 112 can include one or more flanges 122 extending outward relative to the first surface 106 such that the flanges 122 are exposed to and accessible from the exterior region of the vacuum component 102. If an electrode 112 is a supply electrode, each electrode flange 122 is configured to establish electrical contact with a power supply (not shown). For example, during operation, a radio frequency voltage, e.g., about 300 to about 2000 V, can be applied to the one or more flanges 122 of that supply electrode. If an electrode 112 serves as a return electrode, it can be electrically grounded via the flanges 122.

Figure 2:
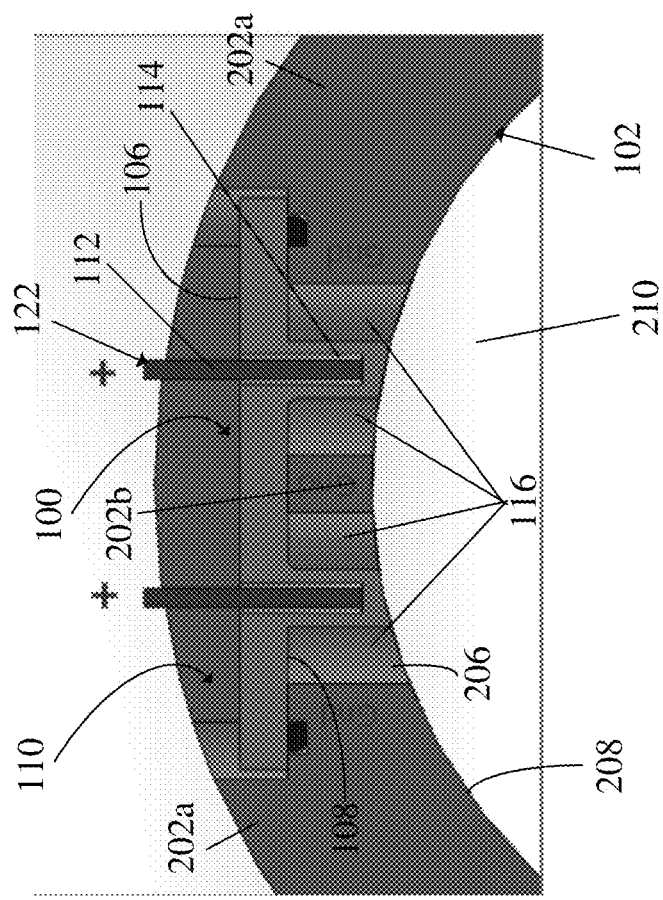
FIG. 2 show an exemplary electrical connection scheme for the plasma source of FIGS. 1a-1c for generating localized plasmas, according to some embodiments of the present invention.

FIG. 2 show an exemplary electrical connection scheme for the plasma source 100 of FIGS. 1a-1c for generating localized plasmas, according to some embodiments of the present invention. As explained above, the plasma source 100 can be disposed into the aperture 110 that is formed or machined into a wall section of the vacuum component 102 (e.g., a vacuum pipe). The aperture 110 can be complementary in shape in relation to at least a portion of the plasma source 100. Once disposed into the aperture 110, the plasma source 100 is oriented within the aperture 110 such that the longitudinal axis A of the plasma source 100 (hence the one or more electrodes 112 of the plasma source 110) aligns with the longitudinal axis of the vacuum pipe 102. In the embodiment shown in FIG. 2, the electrodes 112 serve as supply electrodes, in which case the electrodes 112 can be supplied with a voltage via their respective flanges 122. In some embodiments, one or more of the wall segments 202a, 202b (collectively referred to as "202") of the vacuum component 102 neighboring the electrodes 112 are electrically grounded, driven with opposite polarity, or biased with a voltage relative to ground. For example, these wall segments 202 can be located adjacent to (e.g., next to) the slots 114 of the plasma source 100 that house the electrodes 112. A discharge region 116 can be created between a wall segment 202 and an electrode 112 located in a slot 114. Thus, the plasma source 100 in combination with the wall segments 202 form a barrier dielectric structure.

Upon activation of the plasma source 100 by powering the electrodes 112 of the plasma source 100 and/or the wall segments 202 of the vacuum component 102, a discharge current can be generated within each discharge region 116 located between a slot 114 of the plasma source 100 and an adjacent wall segment 202 of the vacuum component 102. In general, the number of discharge regions 116 in a plasma source 100 is controlled by the number of flat rail electrodes 112 used to construct the plasma source 100. For the embodiment of FIG. 2, there are two flat rail electrodes 112 present in the plasma source 100, thereby creating four discrete discharge regions 116. Each discharge region 116 can be in the form of an elongated trench extending along longitudinal axis A of the plasma source 100. Within each discharge region 116, a discharge current is created that flows substantially parallel to longitudinal axis A of the plasma source 100. In some embodiments, the parallel rail structure enables the current density on barrier dielectric in each discharge region 116 to be substantially uniform along the longitudinal axis A. Because each discharge region 116 is configured to uniformly distribute discharge current, ion bombardment and erosion becomes more evenly distributed, which leads to a longer life for the plasma source 100. In some embodiment, each discharge region 116 is operated at a pressure of between 1 Torr and about 10 Torr. In some embodiments, the discharge current is adapted to dissociate any gas in the discharge region 116 to generate a localized plasma discharge. In some embodiments, the plasma discharge can have a power of about 20 Watts to about 1000 Watts. Each localized plasma discharge is adapted to fill most of the volume of the corresponding discharge region 116.

In some embodiments, each discharge region 116 is exposed to and in fluid communication with the interior region of the vacuum component 102 via an opening 206 on the interior surface 208 of the vacuum component 102. When a gas flow is provided to the vacuum component 102, the gas flow is adapted to travel through the interior region of the vacuum component 102 along the longitudinal direction. Thus the interior region of the vacuum component 102 serves as the primary flow region 210. Mixing through diffusion or turbulence can occur during gas flow that brings un-dissociated gas from the primary flow region 210 of the vacuum component 102 into the discharge regions 116 of the plasma source 100 via the openings 206 of the discharge regions 116. The un-dissociated gas in the discharge regions 116 is adapted to be dissociated by the discharge current in the discharge regions 116 to form a localized plasma discharge. The mixing and/or turbulence can also bring dissociated, atomic radicals from each discharge regions 116 of the plasma source 100 into the primary flow region 210 of the vacuum component 102 via the opening 206 of the discharge region 116. Such mixing and dissociation can occur at every discharge region 116 of the plasma source 100.

Figure 3B:
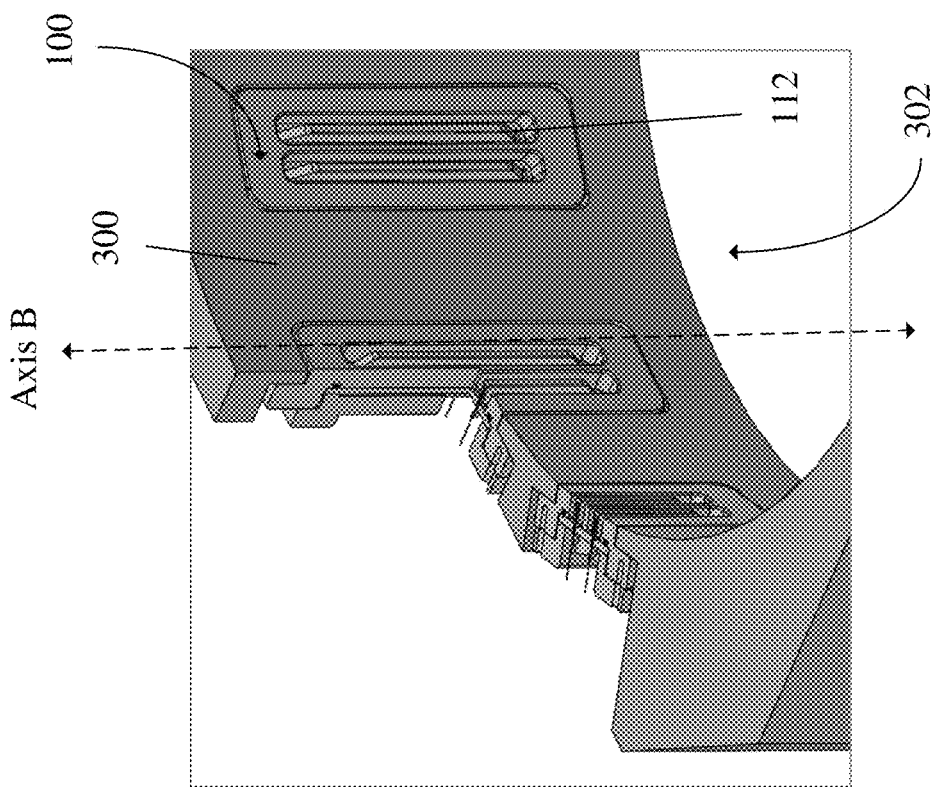
FIGS. 3a and 3b show exploded and sectional views, respectively, of an exemplary arrangement of multiple ones of the plasma source of FIGS. 1a-1c in a vacuum component, according to some embodiments of the present invention.
Figure 3A:
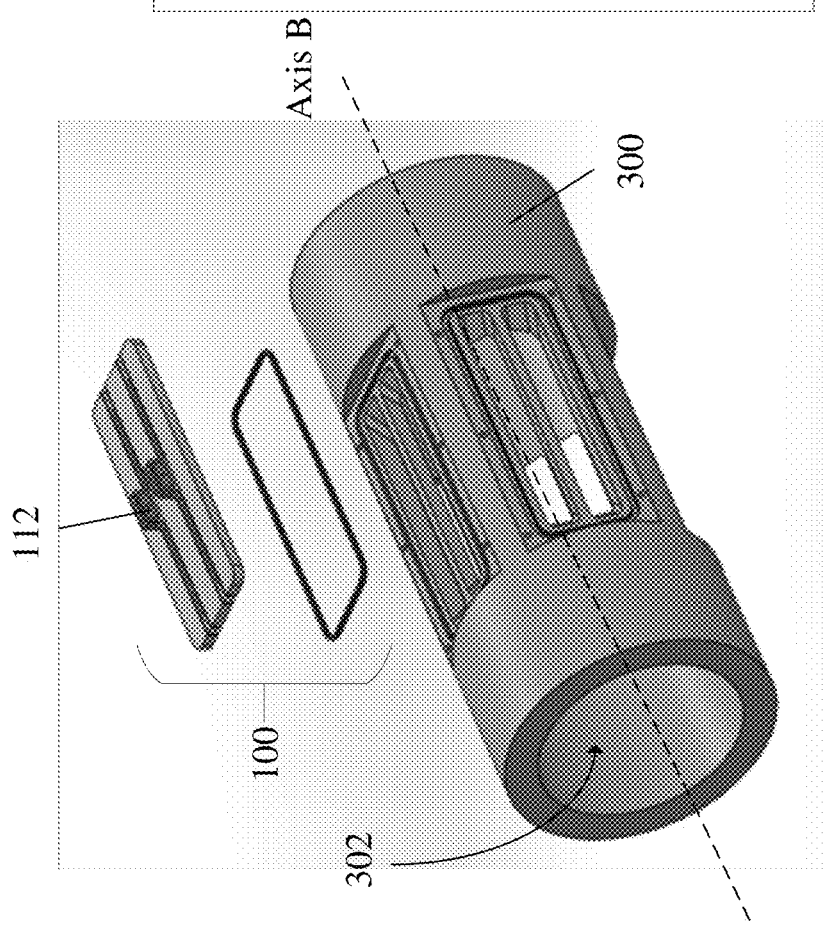

As shown in FIGS. 1a-1c and 2, the parallel-rail plasma source 100 is relative flat, such that the structure can form a facet (e.g., a wall section) of the vacuum component 102 (e.g., a larger vacuum pipe as shown). As well understood by a person of ordinary skill in the art, this parallel-rail plasma source 100 is versatile in its usage and can be incorporated in other vacuum component structures of different shapes and sizes, such a section of a wall of a vacuum chamber or vessel. FIGS. 3a and 3b show exploded and sectional views, respectively, of an exemplary arrangement of multiple ones of the plasma source 100 of FIGS. 1a-1c in a vacuum component structure 300, according to some embodiments of the present invention. As show, four or more of the plasma sources 100 can be arranged as facets around a circumference of the vacuum pipe 300, like a polygon. Each plasma source 100 can be oriented such that the electrodes 112 can be extend parallel to longitudinal axis B of the vacuum pipe 300 in the direction of gas flow. Discrete, discontinuous localized plasmas are adapted to be formed in the discharge regions 116 of respective ones of the plasma sources 100. In some embodiments, the discharge regions 116 of the multiple plasma sources 100 are substantially the same in dimensions to generate substantially uniform regions of plasmas about the longitudinal axis B. This arrangement allows plasmas to be uniformly distributed around the circumference of the pipe 300. As the gas flow travel through the primary flow region 302 in the interior of the pipe 300, diffusion or turbulence occurs to (i) draw fresh gas into the discharge regions 116 of the multiple plasma sources 100 for dissociation and (ii) bring dissociated gas into the larger flow volume of the primary flow region 302. In general, such a distributed plasma source design provides an open cross-sectional structure for maintaining full pumping speed and conductance. In some embodiments, the larger the number of plasma sources 100 are embedded in the wall of the vacuum component 102, the higher power is produced in the vacuum component 102.

Figure 4:
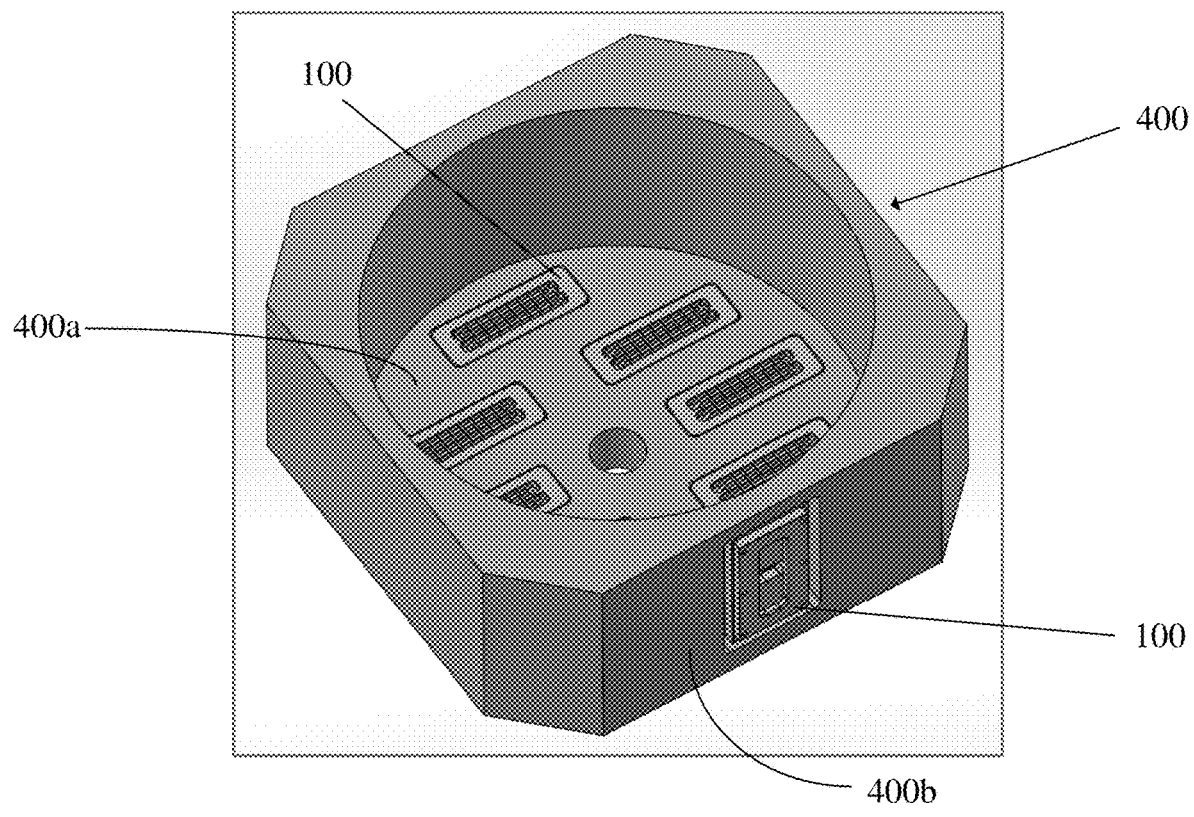
FIG. 4 shows another exemplary arrangement of multiple ones of the plasma source of FIGS. 1a-1c in another vacuum component, according to some embodiments of the present invention.

FIG. 4 shows another exemplary arrangement of multiple ones of the plasma source 100 of FIGS. 1a-1c in another vacuum component 400, according to some embodiments of the present invention. As shown, the vacuum component 400 is a vacuum chamber having the plasma sources 100 mounted/embedded in different wall sections of the vacuum chamber 400. As shown, one or more plasma sources 100 can be mounted on the bottom wall (i.e., bottom floor) 400a of the vacuum chamber 400 and one or more plasma sources 100 can be mounted on the side wall(s) 400b of the vacuum chamber 400.

Figure 5:
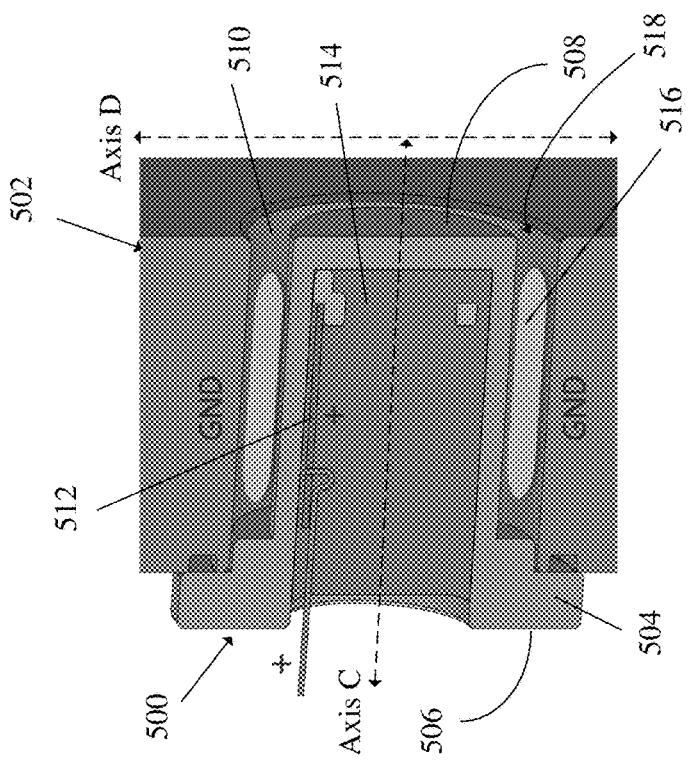
FIG. 5 shows another exemplary plasma source configured to form a section of a wall of a vacuum component, according to some embodiments of the present invention.

FIG. 5 shows another exemplary plasma source 500 configured to form a section of a wall of a vacuum component 502, according to some embodiments of the present invention. The plasma source 500 has a cylindrical plug-style construction and is adapted to be disposed as a plug into a complementary cylindrical aperture 510 located within the wall of the vacuum component 502. As shown in FIG. 5, the plug-style plasma source 500 is adapted to be oriented relative to the vacuum component 502 such that a longitudinal axis (Axis C) of the plasma source 500 extends substantially perpendicular to the wall of the vacuum component 502 (e.g., perpendicular to a longitudinal axis D defined by the wall of the vacuum component 502). Once installed, a first surface 506 of the plasma source 500 is exposed to an exterior region of the vacuum component 502, and a second surface 508 of the plasma source 500 is exposed to an interior region of the vacuum component 502.

As shown, the plug-style plasma source 500 has a generally cylindrical/tubular body 504 comprising a dielectric member of electrically non-conductive material, such as a ceramic material. At least one electrode 512 is disposed in a substantially cylindrical receiving channel 514 (e.g., the interior region) of the body 504 with at least a portion of the dielectric member located adjacent to the electrode 512. For example, each electrode 512 can be in the form of a thermally and electrically conductive cylindrical busbar potted within the receiving channel 514 and substantially surrounded by the dielectric member of the body 504. In some embodiments, a high-temperature potting material is disposed in the receiving channel 514 of the cylindrical body 504 to hold the electrode 512 in place. In some embodiments, the potting material has a matching dielectric constant equal to or near the dielectric constant of the dielectric member of the plasma source body 504. In some embodiments, the electrode 512 is electrically exposed to the exterior region of the vacuum component 502 relative to the first surface 506 for receiving a radio-frequency (RF) current.

In some embodiments, the electrode 512 serves as a supply electrode while the perimeter/wall of the aperture 510 of the vacuum component 502 adjacent to the plasma source serves as the return electrode (e.g., is electrically grounded). Alternatively, an intermediate ground component can be provided, which will be described in detail below with reference to FIG. 6. Further, the plasma source 500 forms at least one discharge region 516 adjacent to the receiving channel 514, where the discharge region 516 is configured to generate a localized plasma therein that is exposed to the interior region of the vacuum component 502. For the embodiment of FIG. 5, the perimeter/wall of the aperture 510 of the vacuum component 502 is electrically grounded, thus serving as a substantially cylindrical ground member that radially surrounds the electrode 512, the dielectric member of the body 504, and the discharge region 516. As shown, the discharge region 516 is established between the electrode 512 and the perimeter/wall of the aperture 510 of the vacuum component 502. More specifically, the discharge region 516 is substantially ring-shaped and concentrically sandwiched between the ground member and the dielectric member of the plasma source body 504 having the electrode 512 embedded therein. In some embodiments, the cylindrical aperture 510 (e.g., ground member), the plasma source body 504, the ring-shaped discharge region 516, and the cylindrical electrode 512 are all concentrically disposed about longitudinal axis C. In some embodiments, the discharge region 516 is exposed to and in fluid communication with the interior region of the vacuum component 502 via an opening 518 on the interior surface of the vacuum component 502.

Figure 6:
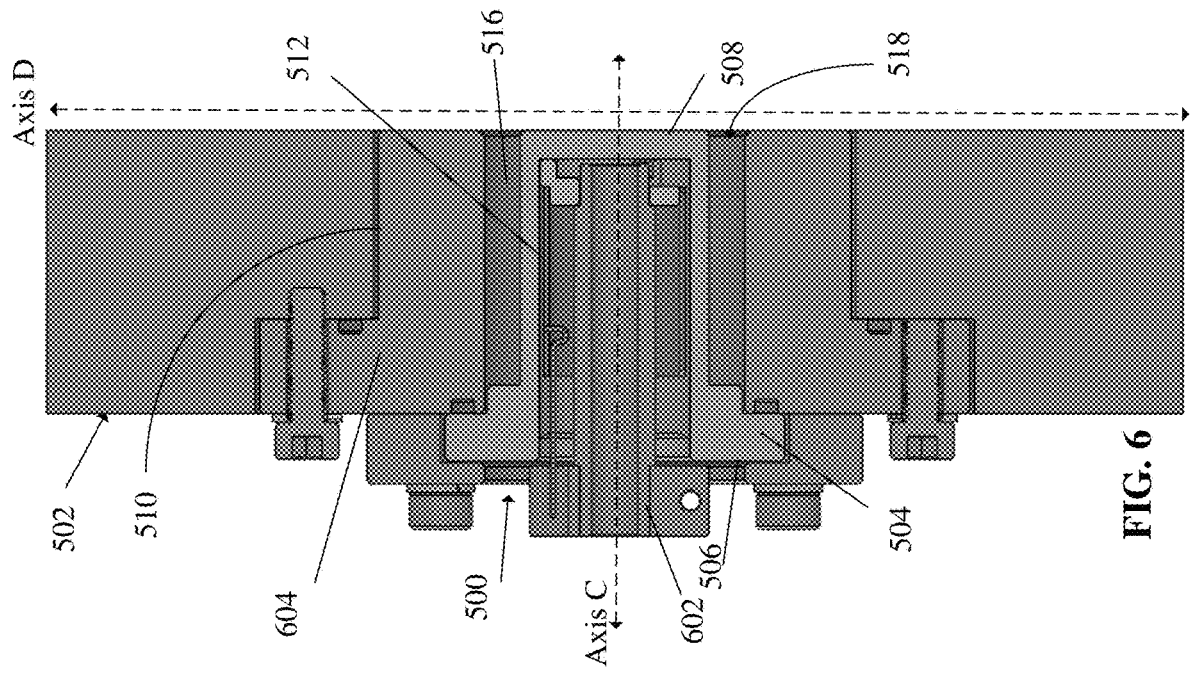
FIG. 6 shows the plasma source of FIG. 5 incorporating a heatsink, according to some embodiments of the present invention.

In some embodiments, a vacuum seal (not shown) is located between the body 504 of the plasma source 500 and the vacuum component 502 to provide a fluid seal therebetween. In some embodiments, an optional heatsink is incorporated into the plug-style plasma source 500 to conduct heat away from the potted assay. FIG. 6 shows the plasma source 500 of FIG. 5 incorporating a heatsink 602, according to some embodiments of the present invention. The heatsink 602 can be potted within the receiving channel 514 of the dielectric member of the plasma source body 504 adjacent to the electrode 512 that is also within the receiving channel 514. Other cooling techniques that may be employed by the plasma source 500 include direct water cooling and/or incorporation of one or more heat pipes. In some embodiments, instead of electrically grounding the perimeter/wall of the aperture 510 of the vacuum component 502 adjacent to the plasma source 500 as shown in FIG. 5, a cylindrical intermediate component 604 is provided that is adapted to be electrically grounded to facilitate the formation of the ring-shaped discharge region 516 of the plasma source 500. As shown in FIG. 6, the cylindrical intermediate component 604 is sandwiched between the plasma source body 504 and the aperture 510 of the vacuum component 502.

Upon activation of the plasma source 500 by powering the electrode 512, a discharge current can be generated within the discharge region 516. The discharge current is adapted to flow substantially parallel to the longitudinal axis C of the plasma source 500. In some embodiments, the discharge current is adapted to dissociate gas in the discharge region 516 to generate a localized plasma discharge. Each localized plasma discharge is adapted to fill most of the volume of the discharge region 516.

Figure 7:
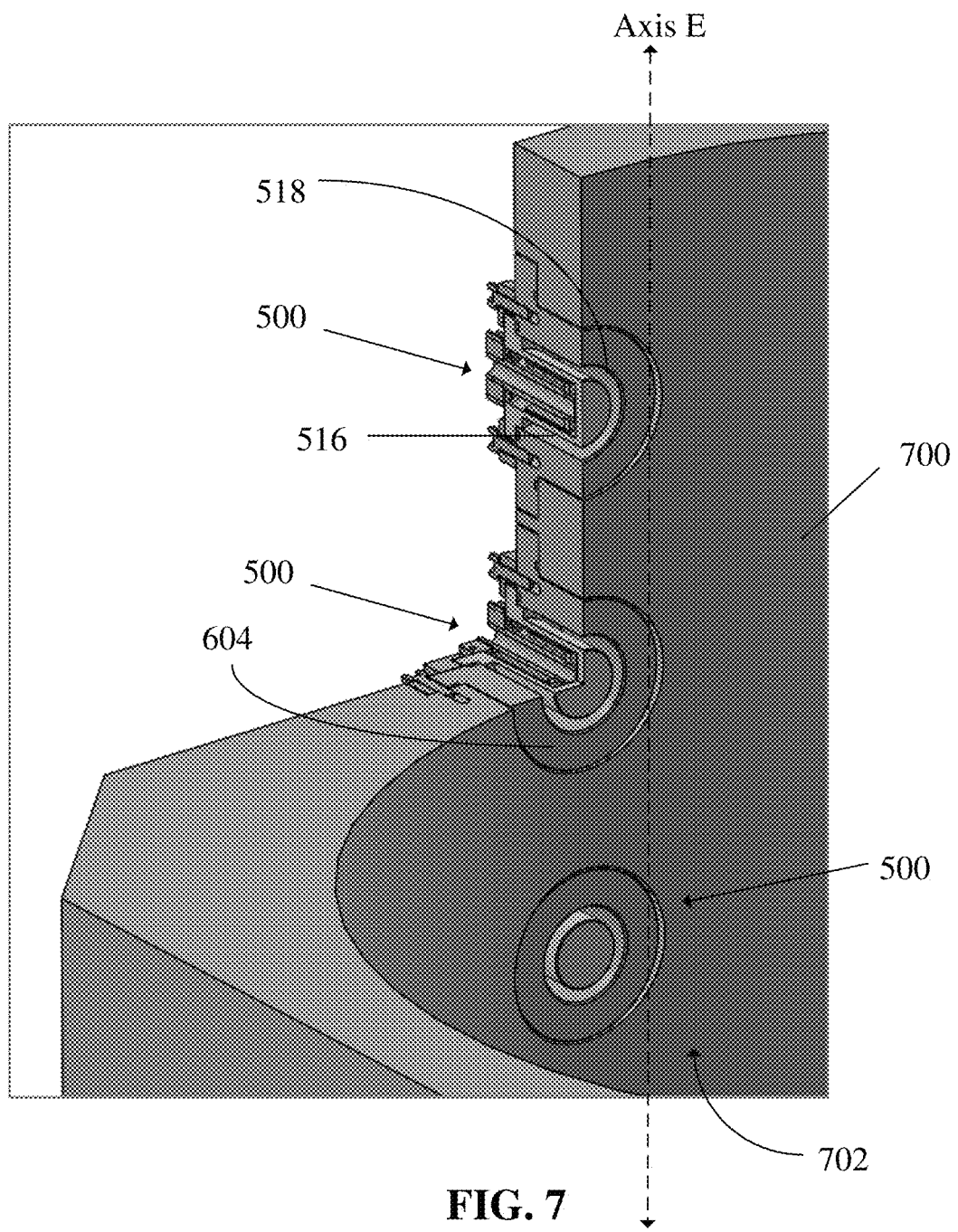
FIG. 7 shows an exemplary arrangement of multiple ones of the plasma source of FIG. 6 in a vacuum pipe, according to some embodiments of the present invention.

FIG. 7 shows an exemplary arrangement of multiple ones of the plasma source 500 of FIG. 6 in a vacuum pipe 700, according to some embodiments of the present invention. As show, the plasma sources 500 can be arranged along the longitudinal axis E of the vacuum pipe 700. Discrete, discontinuous localized plasmas are adapted to be formed in the discharge regions 516 of respective ones of the plasma sources 500. In some embodiments, the discharge regions 516 of the multiple plasma sources 500 are substantially the same in dimensions to generate substantially uniform regions of plasmas. When a gas flow is provided to the vacuum pipe 700, the gas flow is adapted to travel through the interior region 702 of the vacuum pipe 700 along longitudinal axis E. Thus, the interior region 702 of the vacuum pipe 700 serves as the primary flow region. Mixing through diffusion or turbulence can occur during gas flow that brings fresh, un-dissociated gas from the primary flow region 702 into the discharge regions 516 of the plasma sources 500 via the respective ring-shaped openings 518 of the discharge regions 116. The fresh gas in the discharge regions 516 is adapted to be dissociated by the discharge current in the discharge regions 516 to form localized plasma discharges. The mixing and/or turbulence can also bring dissociated, atomic radicals from the discharge regions 516 of the plasma sources 500 into the primary flow region 702 of the vacuum pipe 700 via the openings 518 of the respective discharge regions 516. Such mixing and dissociation can occur at every discharge region 516 of the plasma sources 500. Therefore, similar to the arrangement of FIGS. 3a and 3b, this distributed plasma source arrangement also provides an open cross-sectional structure for maintaining full pumping speed and conductance. Further, As well understood by a person of ordinary skill in the art, the plug-style plasma source design 500 of FIGS. 5 and 6 can be positioned on other vacuum components, such as a processing chamber to maintain full pumping speed and conductance. In addition, this design can be scaled accordingly (e.g., include different numbers and/or arrays of plasma sources 500) to accommodate vacuum components of different sizes and/or shapes to achieve customized configurations and assemblies.

Figure 10:
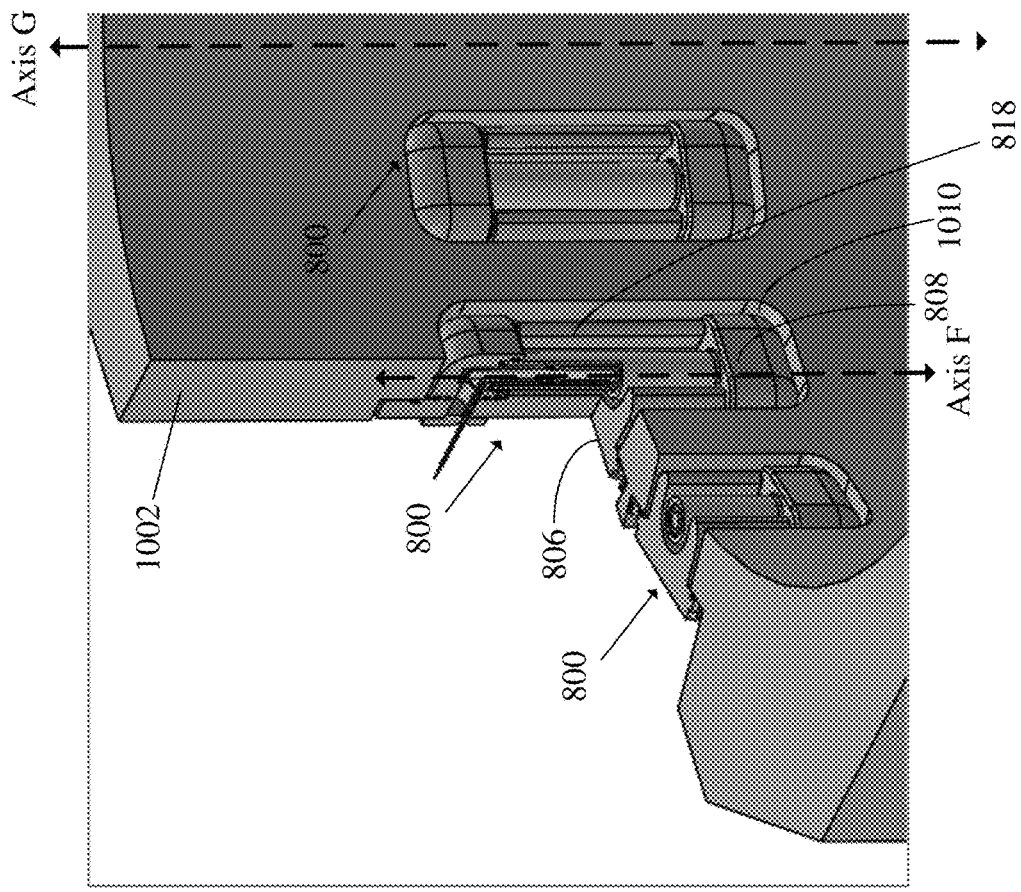
FIG. 10 shows an exemplary arrangement of multiple ones of the plasma source of FIG. 9 in a vacuum component to form sections of a wall of the vacuum component, according to some embodiments of the present invention.
Figure 9:
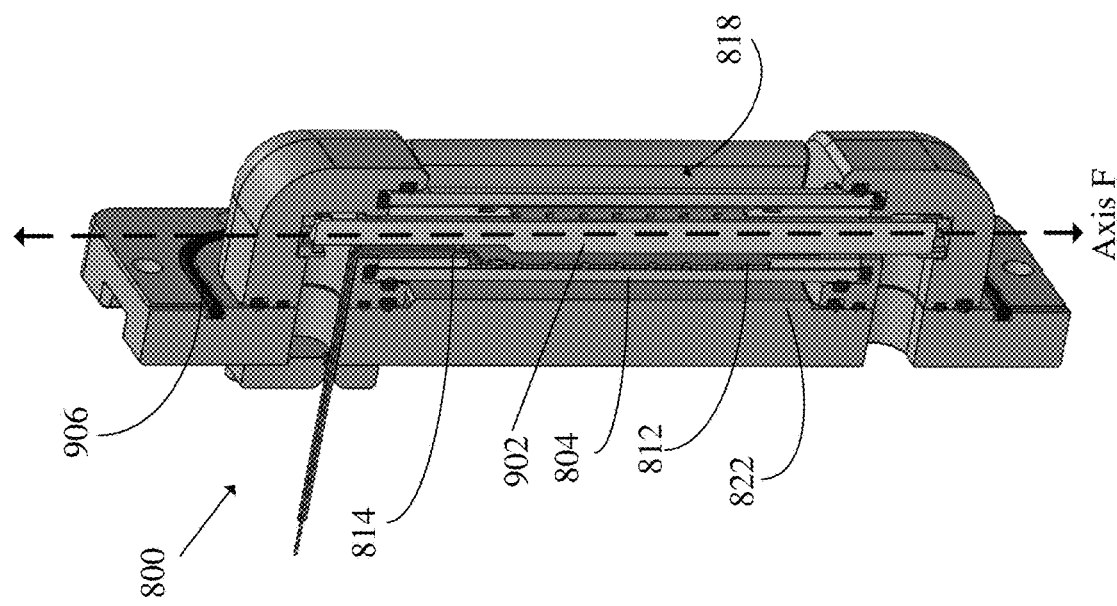
FIG. 9 shows the plasma source of FIGS. 8a and 8b incorporating a heatsink, according to some embodiments of the present invention.

FIGS. 8a and 8b show sectional and top views, respectively, of yet another exemplary plasma source 800, according to some embodiments of the present invention. FIG. 9 shows the plasma source 800 of FIGS. 8a and 8b incorporating a heatsink 902, according to some embodiments of the present invention. FIG. 10 shows an exemplary arrangement of multiple ones of the plasma source 800 of FIG. 9 in a vacuum component 1002 to form sections of a wall of the vacuum component 1002, according to some embodiments of the present invention.

As shown in FIG. 10, each plasma source 800 is substantially cylindrical in construction and is adapted to be mounted in a cylindrical aperture 1010 located within the wall of the vacuum component 1002 (see FIG. 10). Each cylindrical plasma source 800 is adapted to be oriented relative to the vacuum component 1002 such that a longitudinal axis (Axis F) of the plasma source 800 extends substantially parallel to the wall of the vacuum component 1002 (e.g., parallel to longitudinal axis G defined by the wall of the vacuum component 1002). Once installed, a first surface 806 of the plasma source 800 is exposed to an exterior region of the vacuum component 1002, and a second surface 808 of the plasma source 800 is exposed to an interior region of the vacuum component 1002.

More particularly, as shown in FIGS. 8a and 8b, each cylindrical plasma source 800 includes a generally cylindrical body 804 comprising a dielectric member of electrically non-conductive material, such as a ceramic material. At least one electrode 812 is disposed in a substantially cylindrical receiving channel 814 (e.g., the interior region) of the body 804 with at least a portion of the dielectric member located adjacent to the electrode 812. For example, each electrode 812 can be in the form of a thermally and electrically conductive cylindrical busbar potted within the receiving channel 814 and substantially surrounded by the dielectric member of the body 804. In some embodiments, a high-temperature potting material is disposed in the receiving channel 814 of the cylindrical body 804 for holding the electrode 812 in place. In some embodiments, the potting material has a matching dielectric constant equal to or near the dielectric constant of the dielectric member of the plasma source body 804. In some embodiments, the electrode 812 is electrically exposed to the exterior region of the vacuum component 802 relative to the first surface 806 for receiving a radio-frequency (RF) current. In some embodiments, the plasma source 800 includes a ground member 822 configured to longitudinally encase the dielectric plasma source body 804, along with the electrode 812 disposed in the receiving channel 814 of the body 804. In some embodiments, the cylindrical plasma source 800 is substantially similar in construction to the plug-style plasma source 500 described above, except the cylindrical plasma source 800 is oriented parallel, instead of perpendicular, to the wall of vacuum component 1002 when installed into the vacuum component 1002.

In some embodiments, as shown in FIG. 9, a vacuum seal 906 is located between the body 804 of the plasma source 800 and the vacuum component 1002 to provide a fluid seal therebetween. In some embodiments, as shown in FIG. 9, an optional heatsink 902 is incorporated into the plasma source 800 to conduct heat away from the potted assay. The heatsink 902 can be potted within the receiving channel 814 of the dielectric member of the plasma source body 804 adjacent to the electrode 812 that is also within the receiving channel 814. Other cooling techniques that may be employed by the plasma source 800 include direct water cooling and/or incorporation of one or more heat pipes.

In some embodiments, the electrode 812 serves as a supply electrode, while the ground member 822 serves a return electrode (e.g., is electrically grounded). Further, the plasma source 800 forms at least one ring-shaped discharge region 816 concentrically sandwiched between the ground member 822 and the dielectric member of the plasma source body 804 having the electrode 812 embedded therein. In some embodiments, the ground member 822, the plasma source body 804, the ring-shaped discharge region 816, and the cylindrical electrode 812 are all concentrically disposed about longitudinal axis F of the plasma source 800. In some embodiments, the discharge region 816 is exposed to and in fluid communication with the interior region of the vacuum component 1002 via an opening 818 of the ground member 822. Upon activation of the plasma source 800 by powering the electrode 812, a plasma discharge can be generated within the discharge region 816. In some embodiments, the plasma discharge is adapted to dissociate gas in the discharge region 816.

As shown in FIG. 10, multiple ones of the plasma sources 800 can be arranged around a circumference of the vacuum component 1002, such as a vacuum pipe. Discrete, discontinuous localized plasmas are adapted to be formed in the discharge regions 816 of respective ones of the plasma sources 800. In some embodiments, the discharge regions 816 of the multiple plasma sources 800 are substantially the same in dimensions to generate substantially uniform regions of plasmas. When a gas flow is provided to the vacuum component 1002, the gas flow is adapted to travel through the interior region 1004 (i.e., primary flow region) of the vacuum component 1002 along longitudinal axis E. Mixing through diffusion or turbulence can occur during gas flow that brings fresh, un-dissociated gas from the primary flow region 1004 into the discharge regions 816 of the plasma sources 800 via the respective openings 818 of the discharge regions 816. The fresh gas in the discharge regions 816 is adapted to be dissociated by the localized plasma discharges in the discharge regions 816. The mixing and/or turbulence can also bring dissociated, atomic radicals from the discharge regions 816 of the plasma sources 800 into the primary flow region 1004 of the vacuum component 1002 via the openings 818 of the respective discharge regions 816. Therefore, similar to the arrangements of FIGS. 3a and 3b and FIG. 7, this distributed plasma source arrangement also provides an open cross-sectional structure for maintaining full pumping speed and conductance. Further, As well understood by a person of ordinary skill in the art, the cylindrical plasma source design 800 of FIGS. 8a-9 can be incorporated into other vacuum components, such as a processing chamber, to maintain full pumping speed and conductance. In addition, this design can be scaled accordingly (e.g., include different numbers and/or arrays of plasma sources 800) to accommodate vacuum components of different sizes and/or shapes to achieve customized configurations and assemblies.

Figure 11:
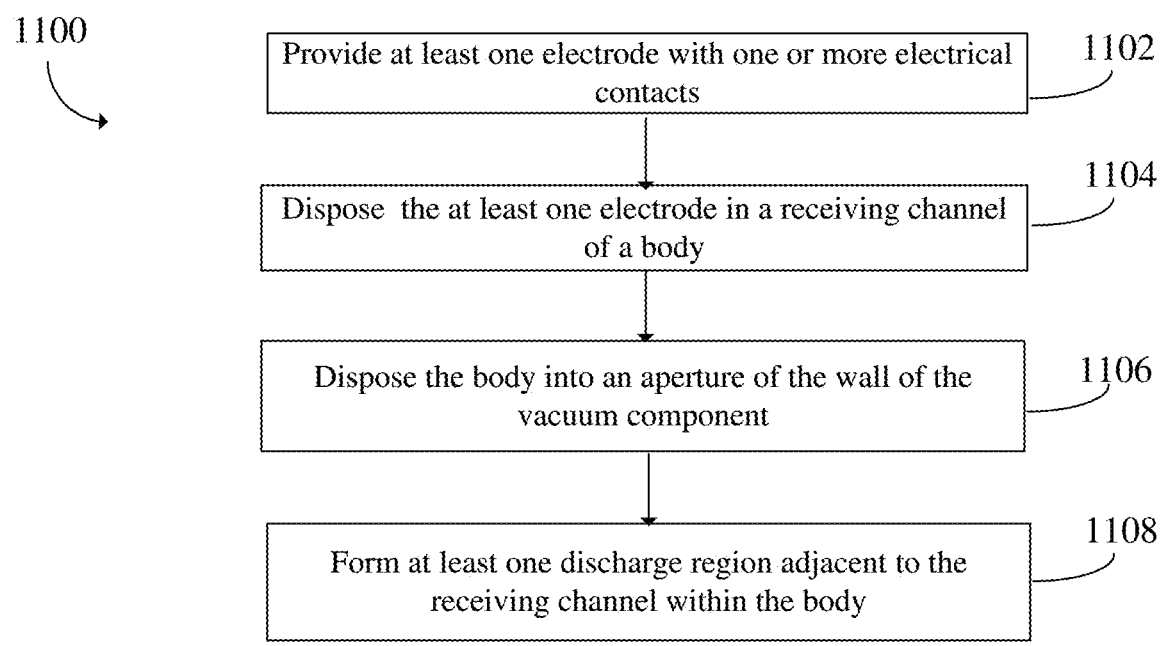
FIG. 11 shows an exemplary process for manufacturing a plasma source suitable for installation into a wall section of a vacuum component, accordingly to some embodiments of the present invention.

FIG. 11 shows an exemplary process 1100 for manufacturing a plasma source, such as plasma sources 100, 500, 800, suitable for installation into a wall section of a vacuum component, accordingly to some embodiments of the present invention. At step 1102, at least one electrode 112, 512, 812 is provided with one or more electrical contacts. At step 1104, the electrode 112, 512, 812 is disposed into a corresponding receiving channel 114, 514, 814 of a plasma source body 104, 504, 804 where the plasma source body is composed of a dielectric member and defines a first surface 106, 506, 806 exposed to an exterior region of the vacuum component and a second surface 108, 508, 808 exposed to an interior region of the vacuum component. The electrode 112, 512, 812 is located relative to the plasma source body 104, 504, 804 such that at least a portion of the dielectric member of the body 104, 504, 804 is adjacent to the electrode 112, 512, 812. Optionally, a heatsink (e.g., heatsink 602, 902) can be embedded in the receiving channel substantially surrounded by the electrode and/or the dielectric member of the plasma source body. At step 1106, upon installation, the plasma source 100, 500, 800 is disposed into an aperture 110, 510, 1010 on the wall of the vacuum component in an orientation that allows the electrical contacts of the electrode 112, 512, 812 to be exposed to the exterior region of the vacuum component at the first surface 106, 506, 806 of the plasma source body, thereby permitting the electrical contacts to be accessible from the exterior region of the vacuum component. Optionally, a vacuum seal (e.g., vacuum seal 120) can be coupled to the plasma source body 104, 504, 804 such that the plasma source forms a fluid seal with the vacuum component when disposed in the aperture 110, 510, 1010.

In some embodiments, as illustrated in FIGS. 1a-4, the plasma source 100 is relatively flat and the electrode is a conductive flat rail 112 buried into and surrounded by the dielectric member of the plasma source body 104. In some embodiments, multiple electrodes are embedded in the dielectric member. For example, multiple conductive flat rails can be buried substantially parallel to each other within the dielectric member. In some embodiments, as illustrated in FIGS. 5-7, the plasma source 500 is substantially cylindrical and the electrode is an electrically and thermally conductive cylindrical busbar 512 embedded in the dielectric member of the plasma source body 504 with a longitudinal axis C oriented substantially perpendicular to the longitudinal axis D of the wall of the vacuum component. In some embodiments, as illustrated in FIGS. 8a-10, the plasma source 800 is substantially cylindrical and the electrode is an electrically and thermally conductive cylindrical busbar 812 embedded in the dielectric member of the plasma source body 804 with a longitudinal axis F oriented substantially parallel to the longitudinal axis G of the wall of the vacuum component.

At step, 1108, at least one discharge region 116, 516, 816 is formed within the plasma source 100, 500, 800, where the discharge region 116, 516, 816 is located adjacent to the receiving channel 114, 514, 814 of the plasma source body 104, 504, 804. The discharge region 116, 516, 816 is adapted to be exposed to the interior region of the vacuum component via an opening 206, 518, 818 on the second surface 108, 508, 808 of the plasma source body 104, 504, 804. A localized plasma forms within the discharge region 116, 516, 816 upon activation of the plasma source 100, 500, 800. In some embodiments, to activate the plasma source 100, 500, 800, an RF current is provided to the one or more electrodes 112, 512, 812 from the external region of the vacuum component. In addition, a grounding element of the plasma source 100, 500, 800 (e.g., either a neighboring section of the wall of the vacuum component or an intermediate grounding component between the dielectric member of the plasma source body and the vacuum component) is electrically grounded. A gas is provided to the interior region (e.g., the primary flow region) of the vacuum component, which is adapted to flow into the discharge region 116, 516, 816 of each plasma source 100, 500, 800 that is incorporated into the vacuum component, such as via the opening 206, 518, 818 between the discharge region and the primary flow region of the vacuum component. The resulting mixing through diffusion or turbulence is adapted to (i) bring un-dissociated gas from the primary flow region of the vacuum component into each discharge regions for disassociation by the discharge current in the discharge regions to form a localized plasma discharge, and (ii) bring dissociated, atomic radicals from the discharge region into the primary flow region.

In some embodiments, the process 110 further includes disposing multiple ones of the plasma sources 100, 500, 800 into corresponding apertures along various sections of the wall of a vacuum component to create an array of discharge regions exposed to the primary flow region of the vacuum component. These plasma sources can be substantially the same or different. In general, the plasma sources 100, 500, 800 described herein are small and modular and can be readily scaled to accommodate different semiconductor components and applications. These plasma sources can be used in an organized array and/or at multiple locations distributed across several strategic points along a wall of a vacuum component. In some embodiments, for each plasma source, the body of the plasma source has a thickness that is about the same as the thickness of the wall of the vacuum component so at to seamless integrate with the wall of the vacuum component.

Figure 12:
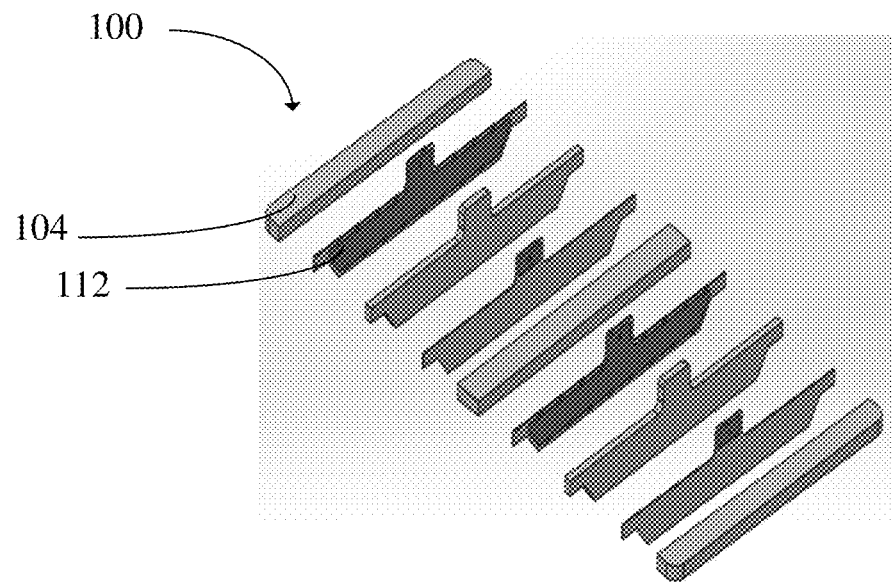
FIG. 12 shows a portion of the flat rail plasma source of FIGS. 1a-3b constructed using an exemplary bonding approach, according to some embodiments of the present invention.

In general, the plasma sources 100, 500 and 800 described herein can be fabricated using a variety of methods. For example, each of the plasma sources can be a co-fired ceramic structure or a bonded structure with metallization encapsulated within a bonder layer. As an example, the flat rail plasma source 100 of FIGS. 1a-3b can be constructed by forming one or more slots 114 in the ceramic body 104, providing electrical ground from the exterior region, and installing one or more conductive electrodes 112 into respective ones of the slot 114 and bonding the one or more electrodes 112 in place. This bonding method allows fabrication using conventional ceramic grinding techniques and does not expose bond lines or seams to the vacuum wetted or plasma exposed surfaces. FIG. 12 shows a portion of the flat rail plasma source 100 of FIGS. 1a-3b constructed using an exemplary bonding approach, according to some embodiments of the present invention. As shown, the plasm source 100 comprises a plurality of ceramic components (representing the plasma source body 104) and a plurality of metal components (representing the electrodes 112) bonded together to form a buried electrode assembly. For the plug-style plasma source 500 of FIGS. 5 and 6 or the cylindrical plasma source 800 of FIGS. 8a-9, the plasma source 500, 800 has an inverted electrode placement that results in the electrode 512, 812 being installed inside of the tubular dielectric body 504, 804, thus avoiding the need to be co-fired under the surface of the outer diameter of the dielectric body 504, 804. This method of construction allows for a significant reduction in cost by removing the need for a buried electrode in a co-fired assembly. This simplification also allows for the possibility of using multiple ceramic materials or dielectric base materials, including, for example, alumina ($AL_2O_3$), zirconia dioxide ($ZrO_2$), Yttria, and aluminum nitride (ALN).

Figure 13:
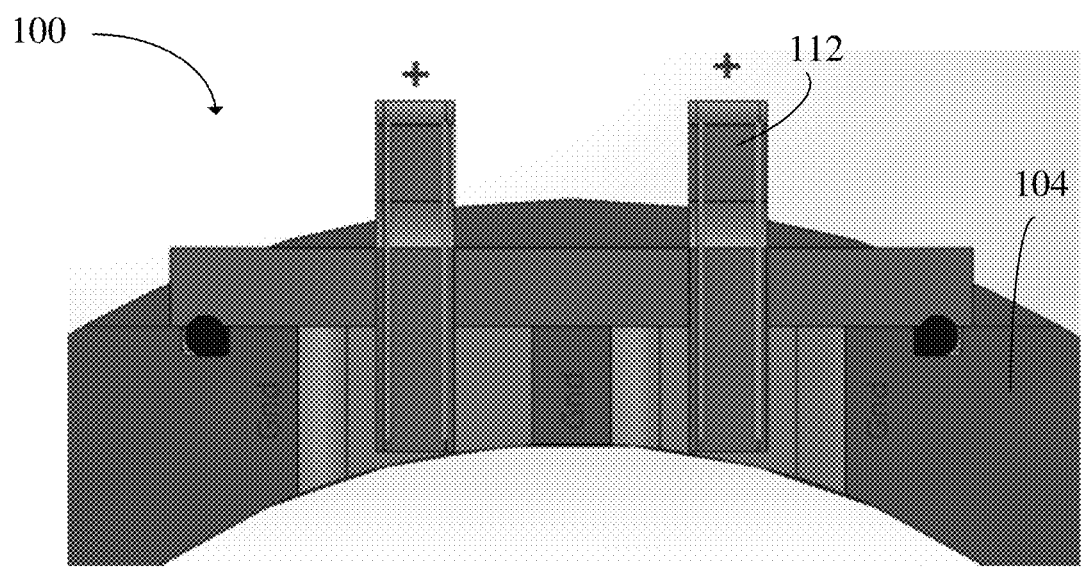
FIG. 13 shows the flat rail plasma source of FIGS. 1a-3b constructed using an exemplary co-fire approach, according to some embodiments of the present invention.

In some embodiments, the plasma sources 100, 500 and 800 described herein can be fabricated using a co-fired ceramic approach. FIG. 13 shows the flat rail plasma source 100 of FIGS. 1a-3b constructed using an exemplary co-fire approach, according to some embodiments of the present invention. As shown, the ceramic layers (representing the plasma source body 104) are in a green state and are co-fired with and the metallization layers (including the electrodes 112) to form one integral buried electrode assembly.

While the invention has been particularly shown and described with reference to specific embodiments, it should be understood by those skilled in the art that various changes in form and detail may be made therein without departing from the spirit and scope of the invention as defined by the appended claims.

What is claimed is:

1. A plasma source configured to form a section of a wall of a vacuum component, the plasma source comprising:
a body comprising a dielectric member, a first surface exposed to an exterior region of the vacuum component, and a second surface exposed to an interior region of the vacuum component, wherein the body is adapted to be disposed into an aperture of the wall of the vacuum component;
at least one electrode disposed in a receiving channel of the body with at least a portion of the dielectric member located adjacent to the at least one electrode in the receiving channel, the at least one electrode being electrically exposed to the exterior region of the vacuum component at the first surface for receiving a radio-frequency (RF) current; and
at least one discharge region adjacent to the receiving channel within the body, the at least one discharge region exposed to the interior region of the vacuum component via an opening on the second surface of the body, wherein a plasma is adapted to be formed within the at least one discharge region.

2. The plasma source of claim 1, wherein the at least one electrode is a conductive flat rail buried into and substantially surrounded by the dielectric member.

3. The plasma source of claim 2, wherein the flat rail is inserted into a slot formed in the dielectric member.

4. The plasma source of claim 2, wherein a neighboring section of the wall of the vacuum component relative to the plasma source is grounded to generate the plasma within the discharge region of the plasma source.

5. The plasma source of claim 1, wherein the at least one electrode comprises a plurality of conductive flat rails buried substantially parallel relative to each other within the dielectric member.

6. The plasma source of claim 1, wherein the electrode comprises an electrically and thermally conductive cylindrical busbar embedded in the dielectric member.

7. The plasma source of claim 6, further comprising a heat sink disposed in the receiving channel substantially surrounded by the electrode and the dielectric member.

8. The plasma source of claim 6, further comprising a substantially cylindrical ground member radially surrounding the electrode, the dielectric member and the discharge region, wherein the ground member is adapted to be electrically grounded to generate the plasma within the discharge region.

9. The plasma source of claim 8, wherein the discharge region is substantially ring-shaped and concentrically sandwiched between the ground member and the dielectric member having the electrode embedded therein.

10. The plasma source of claim 9, wherein the plasma source is oriented such that a longitudinal axis of the plasma source, including the cylindrical electrode, the cylindrical ground member and the ring-shaped discharge region, extends substantially perpendicular to the wall of the vacuum component.

11. The plasma source of claim 6, further comprising a ground member longitudinally encasing the electrode, the dielectric member and the discharge region, wherein the ground member is adapted to be electrically grounded to generate the plasma within the discharge region.

12. The plasma source of claim 11, wherein the plasma source is oriented such that a longitudinal axis of the plasma source extends substantially parallel to the wall of the vacuum component.

13. The plasma source of claim 1, further comprising a vacuum seal located between the body and the vacuum component for providing a fluid seal between the plasma source and the vacuum component.

14. The plasma source of claim 1, wherein the at least one electrode and the dielectric member are joined by one of co-firing or bonding.

15. The plasma source of claim 1, wherein the body defines a thickness extending between the first and second surfaces, the thickness of the body being at least same as a thickness of the wall of the vacuum component.

16. A method of manufacturing a plasma source for forming a section of a wall of a vacuum component, the method comprising:
providing at least one electrode with one or more electrical contacts;
disposing the at least one electrode in a receiving channel of a body, the body comprising a dielectric member, a first surface adapted to be exposed to an exterior region of the vacuum component, and a second surface adapted to be exposed to an interior region of the vacuum component;
locating at least a portion of the dielectric member adjacent to the at least one electrode in the receiving channel;
disposing the body into an aperture of the wall of the vacuum component such that the one or more electrical contacts of the at least one electrode is exposed to the exterior region of the vacuum component at the first surface of the body and the one or more electrical contacts being accessible from the exterior region of the vacuum component; and
forming at least one discharge region adjacent to the receiving channel within the body, the at least one discharge region exposed to an interior region of the vacuum component via an opening on the second surface of the body, wherein a plasma is adapted to be formed within the at least one discharge region.

17. The method of claim 16, further comprising disposing a plurality of the plasma source bodies into respective ones of apertures along various sections of the wall of the vacuum component to create an array of discharge regions exposed to the interior region of the vacuum component.

18. The method of claim 16, further comprising coupling a vacuum seal to the plasma source body such that the plasma source forms a fluid seal with the vacuum component when disposed in the aperture.

19. The method of claim 16, further comprising employing one of co-firing or bonding to join the at least one electrode and the dielectric member.

20. The method of claim 16, further comprising:
providing a radio-frequency (RF) current to the one or more electrical contacts of the at least one electrode;
electrically grounding a ground element of the plasma source or a neighboring wall section of the vacuum component;
providing a gas to the interior region of the vacuum component that is adapted to flow into the discharge region of the plasma source via the opening on the interior surface of the body; and
generating the plasma in the at least one discharge region of the plasma source.

21. The method of claim 16, wherein the at least one electrode is a conductive flat rail buried into and surrounded by the dielectric member.

22. The method of claim 21, wherein the at least one electrode comprises a plurality of conductive flat rails buried substantially parallel relative to each other within the dielectric member.

23. The method of claim 16, wherein the at least one electrode comprises an electrically and thermally conductive cylindrical busbar embedded in the dielectric member.

24. The method of claim 23, further comprising embedding a heat sink in the receiving channel substantially surrounded by the electrode and the dielectric member.

25. The method of claim 23, further comprising orienting the plasma source relative to the vacuum component such that a longitudinal axis of the plasma source extends substantially perpendicular to the wall of the vacuum component.

26. The method of claim 23, further comprising orienting the plasma source relative to the vacuum component such that a longitudinal axis of the plasma source extends substantially parallel to the wall of the vacuum component.

* * * * *